United States Patent

Yamamoto et al.

[11] Patent Number: 6,125,265
[45] Date of Patent: Sep. 26, 2000

[54] PORTABLE TELEPHONE DEVICE

[75] Inventors: Naoyuki Yamamoto, Kanagawa; Hideshi Tsugane, Shizuoka, both of Japan

[73] Assignee: Matsushita Electric Industrial Co., Ltd., Osaka, Japan

[21] Appl. No.: 09/070,228

[22] Filed: Apr. 30, 1998

[30] Foreign Application Priority Data

May 23, 1997 [JP] Japan .................................. 9-148463

[51] Int. Cl.⁷ .................................................. H04B 17/00
[52] U.S. Cl. .......................... 455/67.3; 455/63; 455/501; 714/48
[58] Field of Search .................................. 455/35.1, 501, 455/436, 432, 63, 67.3; 370/464; 375/351; 714/48

[56] References Cited

U.S. PATENT DOCUMENTS

| | | | |
|---|---|---|---|
| 4,450,573 | 5/1984 | Noble | 375/351 |
| 5,187,811 | 2/1993 | Baker et al. | 455/35.1 |
| 5,572,622 | 11/1996 | Wigren et al. | 704/228 |
| 5,680,440 | 10/1997 | Ghisler et al. | 455/432 |
| 5,687,184 | 11/1997 | Lorenz et al. | 370/464 |
| 5,862,178 | 1/1999 | Jarvinen et al. | 375/240 |
| 5,870,675 | 2/1999 | Tuutijarvi et al. | 455/436 |

FOREIGN PATENT DOCUMENTS

| | | |
|---|---|---|
| 1005139 | 1/1989 | Japan . |
| 3139933 | 6/1991 | Japan . |
| 4286440 | 10/1992 | Japan . |

*Primary Examiner*—Lee Nguyen
*Assistant Examiner*—Isaak R. Jama
*Attorney, Agent, or Firm*—Pearne & Gordon LLP

[57] ABSTRACT

Voice decoding means 9 includes: voice decoding operation means 10 for performing a decoding operation on encoded voice data of a voice frame from the channel decoding means 6, thereby outputting an analog voice signal and voice power information of the voice frame; voice power operation means 14 for accumulating and averaging the voice power information, and outputting comparative power information; comparing means 16 for comparing voice power information of a received voice frame with the comparative power information, and for, when the difference is not smaller than a threshold, outputting a voice output control signal; and voice output control means 12 for controlling a volume of a voice frame having voice power information in which an abnormality is detected based on the voice output control signal. The voice decoding means 9 detects an erroneous voice frame on the basis of a difference between voice power information. The volume is controlled, so that the generation of an abnormal tone is prevented from occurring.

3 Claims, 2 Drawing Sheets

PORTABLE TELEPHONE DEVICE

BACKGROUND OF THE INVENTION

The invention relates to a portable telephone device which transmits and receives voices through a wireless line.

In a conventional portable telephone device, when a receiving error occurs due to deterioration of an input signal because of deterioration of a wireless line or the like in its quality, a channel decoding unit detects and corrects the error. In the case of a small number of receiving errors, a received data is recovered by error correction, and an encoded voice data is transmitted to a voice decoding unit as a correct voice frame. In the case of no receiving error, the encoded voice data is naturally transmitted from the channel decoding unit to the voice decoding unit as a correct voice frame.

In the case where many receiving errors are included, the channel decoding unit cannot properly perform the error correction. The channel decoding unit performs only the error detection, and transmits the error detection information to the voice decoding unit. The voice decoding unit does not use voice frame information corresponding to the error detection information, so that any abnormal tone cannot be output. An example of such a prior art portable telephone device is shown in FIG. 2. FIG. 2 is a simplified block diagram showing the configuration of a portable telephone device of the prior art.

First, referring to FIG. 2, the configuration of the conventional portable telephone device will be described. In FIG. 2, reference numeral 21 designates the portable telephone device. The portable telephone device 21 comprises an RF signal inputting unit 2 such as an antenna for receiving an RF signal 3 by radio; an RF signal processing unit 4 for converting the received RF signal 3 into a baseband signal 5; a channel decoding unit 6 for performing a channel decoding operation on the baseband signal 5 and outputting an encoded voice data 7 for each frame, for detecting and correcting an error of a voice frame, and for outputting frame error information 8 for an error which cannot be corrected; a voice decoding unit 22 for decoding the encoded voice data 7, and outputting an analog voice signal 18; and a voice generating device 19 such as a loudspeaker which generates a voice based on the analog voice signal 18.

Next, with reference to FIG. 2, the operation of the conventional portable telephone device will be described. In the portable telephone device 1, the RF signal 3 of various conditions such as fading, multipulse, or a weak field is input through the RF signal inputting means 2 to the RF signal processing means 4. The RF signal 3 is converted into the baseband signal 5 in the RF signal processing means 4, and then into the encoded voice data 7 by a channel decoding operation in the channel decoding means 6.

When the baseband signal 5 including a bit error is input, the channel decoding means 6 detects and corrects the error. If the channel decoding means detects an error which cannot be corrected, the channel decoding means supplies the frame error information 8 to the voice decoding means 22. When the voice decoding means 22 receives the frame error information 8, the voice decoding means does not use the encoded voice data 7 which corresponds to the frame error information 8, as the voice frame information. Even if the encoded voice data 7 in which an error is not corrected is received, therefore, any abnormal tone will not be generated.

In the conventional portable telephone device, however, redundant bits used in the error detection in the channel decoding operation performed by the channel decoding means 6 have a finite length, so that a frame error cannot be detected in some cases. In such cases, the frame error information 8 is not generated, and hence the encoded voice data 7 in the corresponding erroneous frame is used in the voice decoding processing in the voice decoding means 22. Based on an erroneous analog voice signal 18 which is output as a result of the above, an abnormal tone is disadvantageously generated.

SUMMARY OF THE INVENTION

The invention has been conducted in order to solve the above-discussed problems. It is an object of the invention to prevent an abnormal tone at a high volume from being generated by an erroneous voice frame, by controlling a volume of the erroneous frame including an abnormality of a voice power which cannot be detected in channel decoding means.

In order to attain the above-mentioned object, a portable telephone device of the invention comprises: RF signal inputting means for receiving an RF signal; RF signal processing means for converting the received RF signal into a baseband signal; channel decoding means for performing a channel decoding operation on the baseband signal and outputting encoded voice data for each voice frame, and for detecting an error of a voice frame and outputting frame error information; voice decoding means for decoding the encoded voice data and outputting an analog voice signal; and a voice generating device for generating a voice in accordance with the analog voice signal, in that when an abnormality is detected in voice power information of an input voice frame, the voice decoding means determines a voice frame corresponding to the voice power information in which the abnormality is detected, to be erroneous, and controls a volume of the voice frame.

The voice decoding means comprises: voice decoding operation means for performing a decoding operation on encoded voice data of a voice frame from said channel decoding means, and outputting an analog voice signal and voice power information of the voice frame; voice power operation means for accumulating and averaging the voice power information, and outputting comparative power information; comparing means for comparing voice power information of a received voice frame with the comparative power information, and for, when the difference is not smaller than a predetermined value, outputting a voice output control signal; and voice output controlling means for controlling a volume of a voice frame having voice power information in which an abnormality is detected, based on the voice output control signal, and said voice decoding means detects an erroneous voice frame on the basis of a difference between voice power information of respective voice frames.

According to the invention, it is possible to obtain a portable telephone device in which, when an abnormality is detected in voice power information in a voice frame, the volume of the voice frame is controlled, whereby an error of the voice frame which cannot be detected by the channel decoding unit is enabled to be detected, so that an abnormal tone can be prevented from being generated by the erroneous voice frame.

According to the portable telephone device of the invention, a portable telephone device comprising: RF signal inputting means for receiving an RF signal; RF signal processing means for converting the received RF signal into a baseband signal; channel decoding means for performing a channel decoding operation on the baseband signal and outputting encoded voice data for each voice frame, and for detecting an error of a voice frame and outputting frame error information; voice decoding means for decoding the encoded voice data and outputting an analog voice signal; and a voice generating device for generating a voice in accordance with the analog voice signal, in that when an abnormality is detected in voice power information of an input voice frame, the voice decoding means determines a voice frame corresponding to the voice power information in which the abnormality is detected, to be erroneous, and controls a volume of the voice frame. The portable telephone device has the following function. Even if an erroneous voice frame cannot be detected in the channel decoding unit, an error of a corresponding voice frame is detected by detection of an abnormality of voice power information in the voice frame, and the volume of the erroneous voice frame is controlled, so that an abnormal tone can be prevented from being generated by the erroneous voice frame.

In a portable telephone device according to the invention, the voice decoding means comprises: voice decoding operation means for performing a decoding operation on encoded voice data of a voice frame from the channel decoding means, and outputting an analog voice signal and voice power information of the voice frame; voice power operation means for accumulating and averaging the voice power information, and outputting comparative power information; comparing means for comparing voice power information of a received voice frame with the comparative power information, and for, when the difference is not smaller than a predetermined value, outputting a voice output control signal; and voice output controlling means for controlling a volume of a voice frame having voice power information in which an abnormality is detected, based on the voice output control signal, and the voice decoding means detects an erroneous voice frame on the basis of a difference between voice power information of respective voice frames. The portable telephone device has the following function. The voice power information is compared with an average value of precedent voice power information. When the difference is not smaller than the predetermined value, the corresponding voice frame is detected as an erroneous voice frame, and the volume of the erroneous voice frame is controlled, so that the generation of an abnormal tone caused by the erroneous voice frame can be accurately prevented from occurring.

In a portable telephone device, the volume of the erroneous voice frame is controlled to be mute or to be a volume of decoded voice data of a previous voice frame. The portable telephone device has the function that, even when an erroneous voice frame of a large voice power is received, an abnormal tone is not generated, and the receiving operation at a volume which is substantially the same as usual can be performed.

DETAILED DESCRIPTION OF THE PREFERRED EMBODIMENTS

Figure 1:
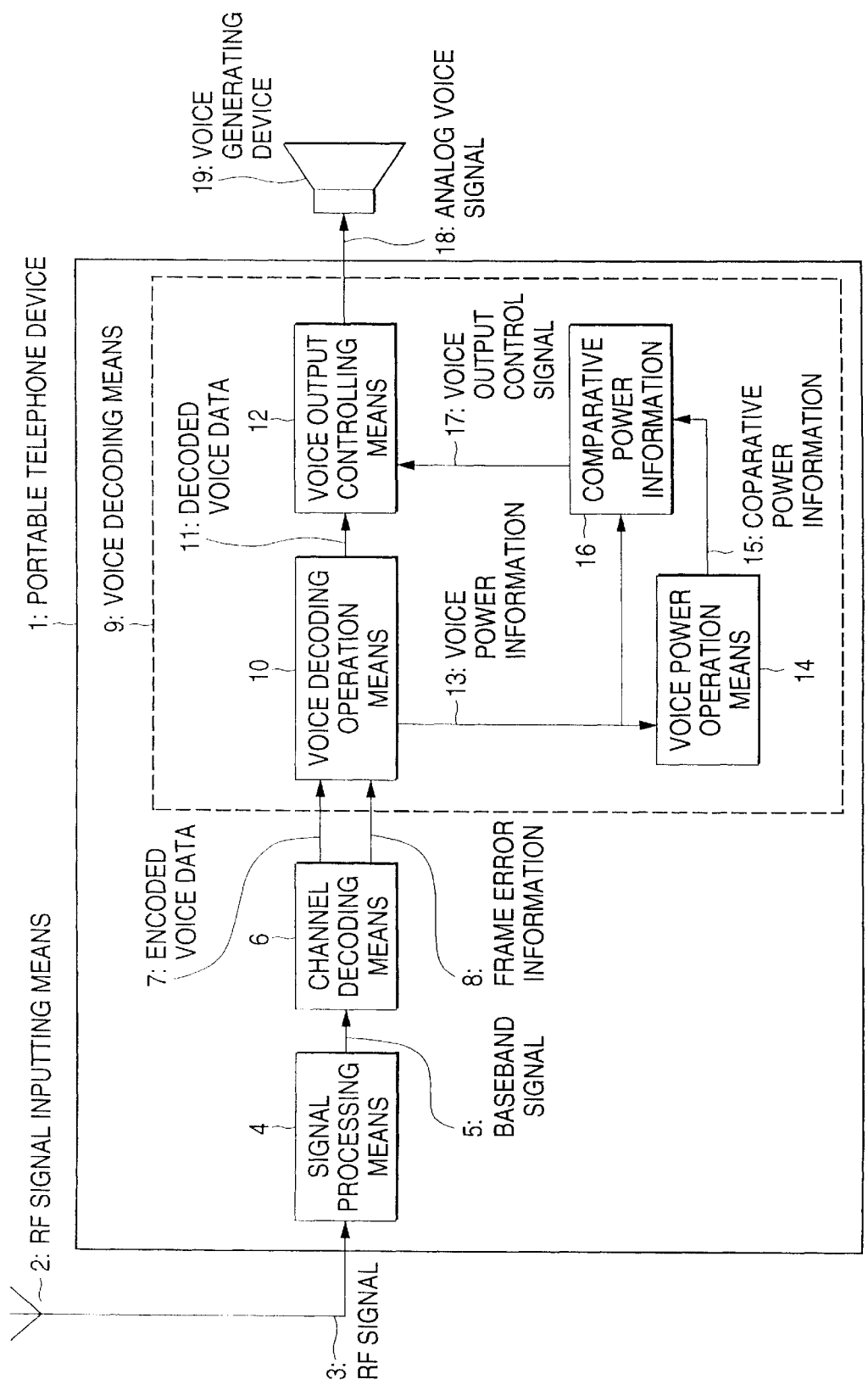
FIG. 1 is a block diagram showing the configuration of a portable telephone device of an embodiment of the invention.
Figure 2:
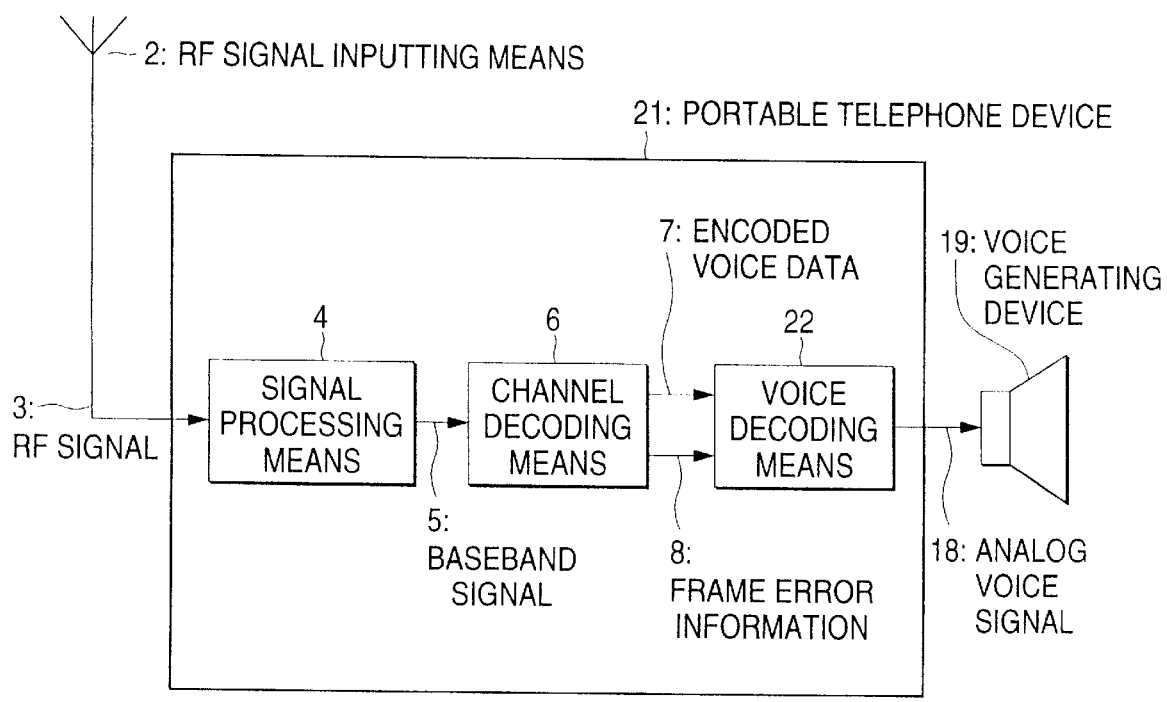
FIG. 2 is a simplified block diagram showing the configuration of a conventional portable telephone device.

Hereinafter, with reference to the accompanying drawing or FIG. 1, a portable telephone device of an embodiment of the invention will be described in detail. FIG. 1 is a block diagram showing the configuration of the portable telephone device of the embodiment of the invention.

First, referring to FIG. 1, the configuration of the portable telephone device of the embodiment of the invention is described. In FIG. 1, reference numeral 1 designates a portable telephone device. The portable telephone device 1 comprises an RF signal inputting unit 2 such as an antenna for receiving an RF signal 3 by radio; an RF signal processing means 4 for converting the received RF signal 3 into a baseband signal 5; and a channel decoding unit 6 for performing a channel decoding operation on the baseband signal 5, and outputting encoded voice data 7 for each frame, for detecting and correcting an error of a voice frame, and for outputting frame error information 8 for an error which cannot be corrected.

The reference numeral 9 designates voice decoding means for decoding the encoded voice data 7 and outputting an analog voice signal 18, and for detecting erroneous encoded voice data 7 or an error of a voice frame which is not detected in the channel decoding means, so as to control the volume of the voice frame, and the reference numeral 19 designates a voice generating device such as a loudspeaker which generates a voice based on the analog voice signal 18. The voice decoding unit 9 comprises a voice decoding operation means 10 for performing a decoding operation on the encoded voice data 7 of a voice frame from the channel decoding means 6 to output an analog voice signal 18 and voice power information; a voice power operation means 14 for accumulating and averaging voice power information of voice frames output from the voice decoding operation means 10, to output comparative power information; a comparing means 16 for comparing voice power information of a received voice frame with the comparative power information produced from precedent voice power information, and outputing a voice output control signal when the volume is not smaller than a predetermined value (threshold); and a voice output controlling means 12 for controlling a volume of a voice frame having voice power information in which an abnormality is detected, based on the voice output control signal. The voice decoding operation means 10, the voice output controlling means 12, the voice power operation means 14, and the comparing means 16 are configured in the voice decoding means 9.

Next, referring to FIG. 1, the operation of the portable telephone device of the embodiment of the invention is described. In the portable telephone device 1, the RF signal 3 of various conditions such as fading, multipulse, or a weak field is input from the RF signal inputting means 2 to the RF signal processing means 4. The RF signal 3 is converted into the baseband signal 5 in the RF signal processing means 4, and then output as encoded voice data 7 obtained in a channel decoding operation in the channel decoding means 6.

The channel decoding means 6 has an error detecting function such as CRC. When the baseband signal 5 including a bit error is input, the channel decoding means detects and corrects the erroneous frame. By contrast, in the case where the erroneous frame is detected by the error detecting function but the error cannot be corrected, the frame error information 8 is transmitted to the voice decoding means 9 as the error information of the frame. When the voice decoding means 9 detects the frame error information 8, the voice output controlling means 12 substitutes decoded voice data of the previous voice frame, or zero-volume or mute voice frame information held by the voice decoding means 9, for the erroneous voice frame in, so that the erroneous voice frame is not used. Thus, the generation of an abnormal tone can be prevented from occurring.

However, the baseband signal 5 which is subjected to the error detection in the channel decoding operation performed by the channel decoding means 6 includes various error patterns depending on the receiving condition of the RF signal 3. In addition, redundant bits for the error detection have a finite length. Thus, it is impossible to detect all errors of the signal. In some cases, consequently, the error detection is failed and an erroneous frame is determined to be a frame including no error.

In such a case that the channel decoding means 6 fails to detect an error of an erroneous frame, the error detection is performed in the following manner. The voice power operation means 14 accumulates the voice power information 13 output from the voice decoding operation means 10 for each frame, and averages the precedent voice power information 13, so as to output comparative power information 15. The comparing means 16 compares the voice power information 13 obtained from the frame with the comparative power information 15.

If the voice power information 13 is larger and the difference is not smaller than the threshold (the predetermined value) set in the comparing means 16, the voice frame is determined to be erroneous, and a voice output control signal 17 is produced. When the voice output controlling means 12 receives the voice output control signal 17, decoded voice data 11 of the previous voice frame or volume-zero information is substituted for the received encoded voice data 7, in the same manner as the case where the frame error information 8 is detected. Thus, the generation of an abnormal tone can be prevented from occurring.

The portable telephone device according to the invention has the above-described configuration. In the voice decoding means, particularly, voice power information of each voice frame is accumulated and averaged and comparative power information is output. The voice power information of the received voice frame is compared with the comparative power information. When the difference is not smaller than a predetermined value, a voice output control signal is output. Based on the voice output control signal, the volume of the voice frame in which an abnormality is detected in the voice power information is controlled to be mute or decoded voice data of the previous voice frame. Even if the channel decoding means fails to detect an error of an erroneous frame, therefore, the generation of a large volume such as an abnormal tone caused by an erroneous voice frame, or the like can be prevented from occurring.

What is claimed is:

1. A portable telephone device comprising:
   RF signal inputting means for receiving an RF signal;
   RF signal processing means for converting the received RF signal into a baseband signal;
   channel decoding means for performing a channel decoding operation on the baseband signal and outputting encoded voice data for a plurality of voice frames, and for detecting an error in said voice frames and outputting frame error information;
   voice decoding means for decoding the encoded voice data and outputting an analog voice signal, and for detecting voice power information of said voice frames; and
   a voice generating device for generating a voice in accordance with the analog voice signal;
   wherein said voice decoding means comprises:
      voice decoding operation means for performing a decoding operation on the encoded voice data of said plurality of voice frames from said channel decoding means, and outputting said analog voice signal and voice power information for each of said plurality of voice frames;
      voice power operation means for accumulating and averaging the voice power information of said plurality of voice frames, and outputting average voice power information;
      comparing means for comparing voice power information of a received voice frame with the average voice power information, and for, when a difference between said voice power information of said received voice frame and said average voice power information is larger than a predetermined value, outputting a voice output control signal indicating that said received voice frame is an abnormal voice frame; and
      voice output controlling means for controlling a volume of said abnormal voice frame, based on the voice output control signal, so as to prevent generation of an abnormal tone.

2. A portable telephone device according to claim 1, wherein the volume of the abnormal voice frame is controlled to be mute.

3. A portable telephone device according to claim 1, wherein the volume of the abnormal voice frame is controlled to be a volume of decoded voice data of a previous voice frame.

* * * * *